United States Patent [19]

Ohashi et al.

[11] Patent Number: 4,999,578

[45] Date of Patent: Mar. 12, 1991

[54] FUNCTION INSPECTING SYSTEM

[75] Inventors: Mitsuo Ohashi; Jun Nakagawa; Kuniyoshi Takahashi, all of Osaka, Japan

[73] Assignee: NEC Home Electronics Ltd., Osaka, Japan

[21] Appl. No.: 296,779

[22] Filed: Jan. 13, 1989

[30] Foreign Application Priority Data

Jan. 20, 1988 [JP] Japan .................. 63-10269

[51] Int. Cl.⁵ .............................................. G01R 1/02
[52] U.S. Cl. ........................... 324/158 F; 324/158 P; 198/346.2
[58] Field of Search ........... 324/73 AT, 158 P, 158 F; 209/555, 571, 573; 198/346.2, 463.2, 457; 437/8

[56] References Cited

U.S. PATENT DOCUMENTS

| | | | |
|---|---|---|---|
| 2,695,098 | 11/1954 | Rendel | 209/555 |
| 3,412,333 | 11/1968 | Frick et al. | 324/158 F |
| 4,348,276 | 9/1982 | Tateishi et al. | 209/573 |
| 4,658,947 | 4/1987 | Welder | 198/346.2 |
| 4,685,551 | 8/1987 | Ono et al. | 198/346.2 |

FOREIGN PATENT DOCUMENTS

| | | | |
|---|---|---|---|
| 0150538 | 12/1984 | European Pat. Off. | |
| 8700821 | 2/1987 | European Pat. Off. | |
| 0046252 | 3/1980 | Japan | 324/73 AT |
| 0101753 | 8/1981 | Japan | 324/73 AT |
| 0122971 | 7/1984 | Japan | 324/158 F |
| 0167883 | 7/1986 | Japan | 324/158 F |
| 8702784 | 5/1987 | PCT Int'l Appl. | 324/73 AT |
| 1412458 | 12/1972 | United Kingdom | |
| 2101063 | 4/1982 | United Kingdom | |
| 2186249 | 8/1987 | United Kingdom | |

Primary Examiner—Reinhard J. Eisenzopf
Assistant Examiner—William J. Burns
Attorney, Agent, or Firm—Cushman, Darby & Cushman

[57] ABSTRACT

A function inspection system having a plurality of inspection units for inspecting the operation of an electronic appliance. The system includes a system of traversers which convey the electronic appliance to different inspection units. The inspection units inspect different functions of the electronic appliance. The traversers are controlled by a controller. The electronic appliance is a printed circuit board in the preferred embodiments.

13 Claims, 4 Drawing Sheets

FIG. 4
LEGEND
SLIDING TRAVERSERS — 31', 32', 36'+37'
INSPECTION UNITS — 21, 22, 25,+26
BELT CONVEYORS — 38', 39', 42'+43', 38", 39", 42"+43"
60, 64+66
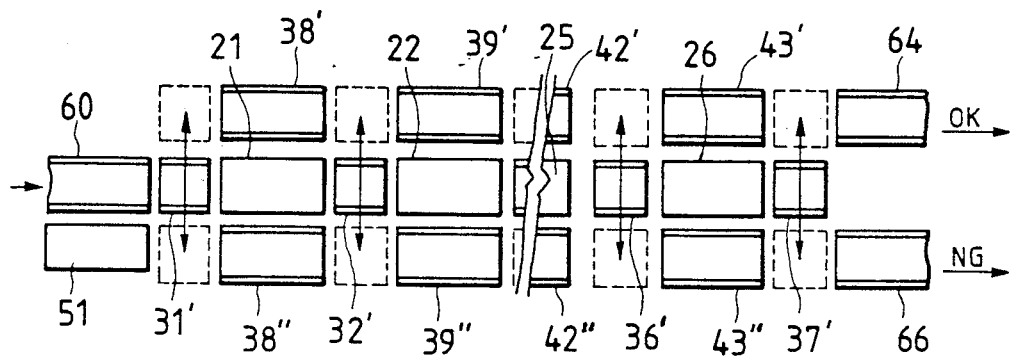
LEGEND
SLIDING TRAVERSERS — 31"+32"
INSPECTION UNITS — 21, 22, 25+26
BELT CONVEYORS — 60, 64+66
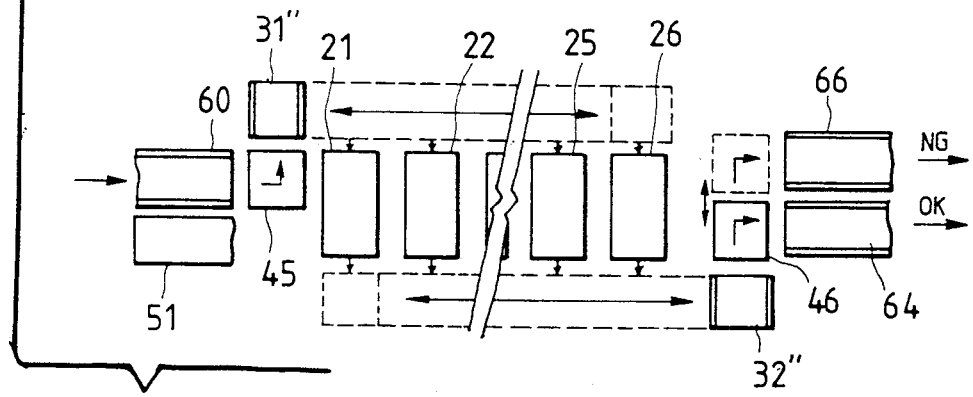
FIG. 5
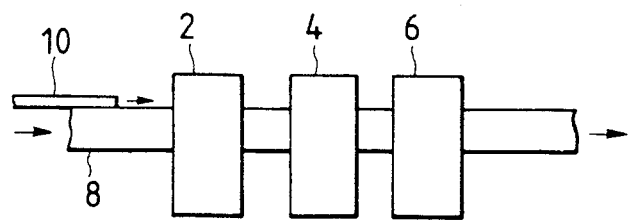
FIG. 6 (PRIOR ART)

4,999,578

FUNCTION INSPECTING SYSTEM

BACKGROUND OF THE INVENTION

1. Field of the Invention

The present invention relates to a functions inspecting system, particularly to a functions inspecting system by which the functions of a plurality of inspected appliances having electronic circuits can be inspected at the same time even if the appliances differ in type from each other.

A conventional functions inspecting system inspects whether or not an appliance which may be a printed circuit board has a defective component part or a defective wiring or can perform a prescribed function. The system can inspect the function of the printed circuit board of a prescribed type at one time, but cannot inspect the functions of printed circuit boards of two or more mutually different types at the same time. FIG. 6 shows a schematic view of the system in which a first inspection unit 2 for inspecting a first item, a second inspection unit 4 for inspecting a second item and a third inspection unit 6 for inspecting a third item are disposed in series with each other so that the printed circuit board 10 conveyed on a belt conveyor 8 or the like is inspected by the inspection units sequentially. The functions or the like of the printed circuit board 10 of the prescribed type can thus be inspected by the inspection units 2, 4 and 6 as the board is conveyed on the belt conveyor 8 or the like. The inspecting functions of the inspection units 2, 4 and 6 can be replaced with others to inspect a printed circuit board of a different type.

Howerver, since the convnetional function inspecting system can inspect the printed circuit board 10 of the prescribed type but cannot inspect printed circuit boards of mutually different types at the same time, the functions of the inspection units 2, 4 and 6 of the system need to be replaced with others if a printed circuit board different in type from the board 10 of the prescribed type is to be inspected by the system. Throughout the period of the replacement, the system can perform no inspection. This is a problem. Besides, it takes a considerably long time to execute the replacement. This is also a problem.

The present invention was made in order to solve the above-mentioned problems. Accordingly, it is an object of the present invention to provide a functions inspecting system which can perform inspection in a shorteded period and can inspect appliances of mutually different types at the same time.

The function inspecting system provided in accordance with the present invention comprises a plurality of the inspection units capable of inspecting the functions of appliances having electronic circuits; a distributive conveyance means capable of conveying in each of the appliances onto any of the inspection units and conveying out the already-inspected appliance from the inspection unit; and a control means capable of reading signs provided on the appliances and indicative of various kinds of information on the appliances, to control the operation of the distributive conveyance means to convey in the appliances onto the inspection units corresponding to the appliances to inspect them.

When the appliance is conveyed to the function inspecting system provided in accordance with the present invention, the sign provided on the appliance is read by the control means so that the means finds out from the type of the appliance which of the inspection units corresponds to the appliance to inspect it. The control means then gives a command to the distributive conveyance means to convey the appliance onto the inspection unit corresponding to the appliance to inspect it. The appliance is thus conveyed onto the corresponding inspection unit by the distributive conveyance means and inspected by the unit. After the appliance is inspected by the unit, the appliance is conveyed out from the function inspecting system by the distributive conveyance means.

Since the function inspecting system has the above-described constitution and operation, the system can inspect a plurality of types of appliances in nearly the same place. For that reason, the period of the inspection of the appliances is shortened. Since the system can inspect a plurality of types of appliances at the same time, the system is appropriate to inspect a large number of types of appliances, the number of which is relatively small. In addition, the system can inspect a large number of appliances of the same type in a greatly shortened period.

BRIEF DESCRIPTION OF THE DRAWINGS

FIG. 4 shows a schematic view of a function inspecting system which is another embodiment of the present invention;

FIG. 5 shows a schematic view of a function inspecting system which is yet another embodiment of the present invention; and FIG. 6 shows a schematic view of a conventional function inspecting system.

Figure 1:
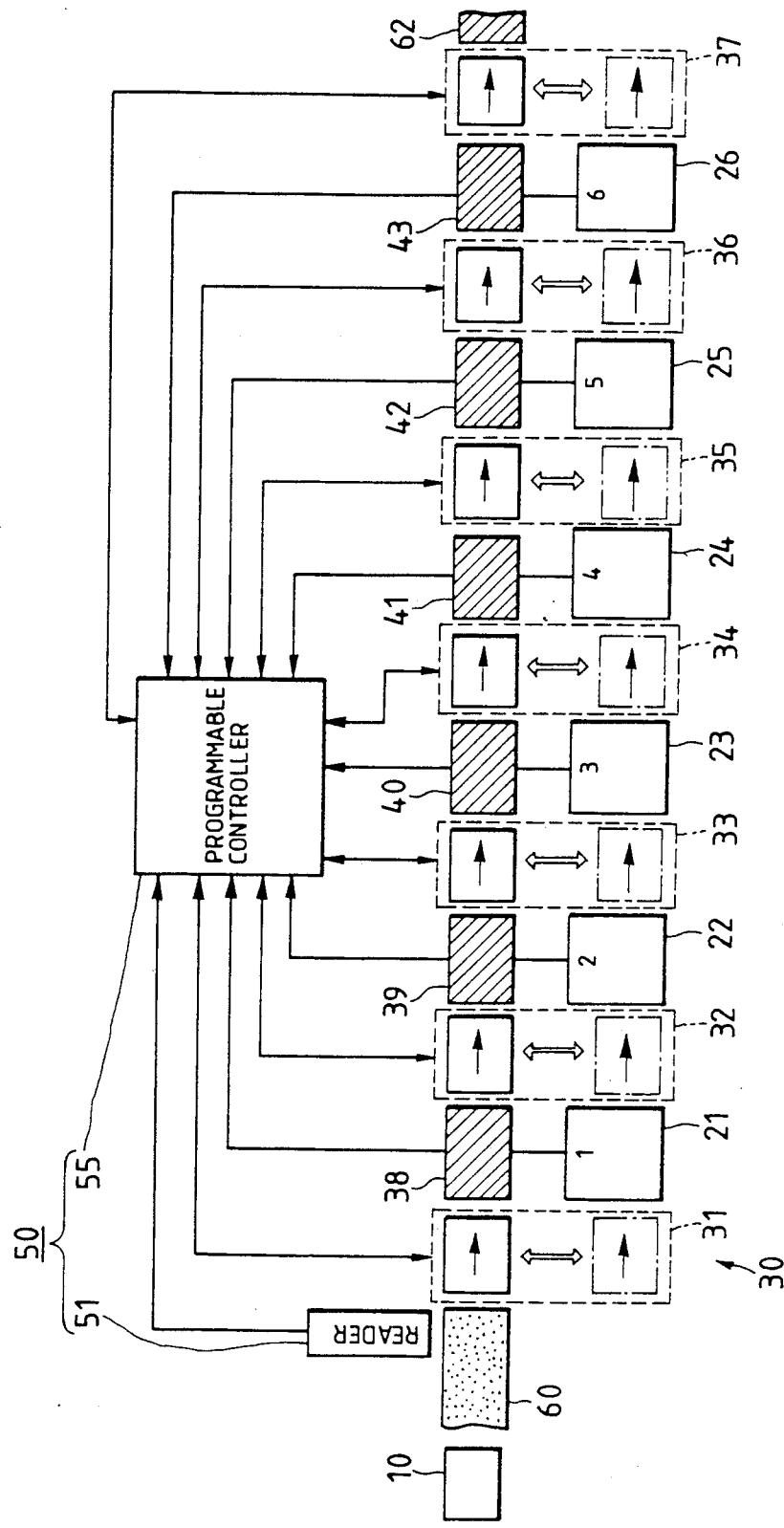
FIG. 1 shows a schematic view of a function inspecting system which is an embodiment of the present invention.

Shown in the drawings are a printed circuit board 10 (inspected appliance), inspection units 21, 22, 23, 24, 25 and 26, a distributive conveyance means 30, and a control means 50.

DETAILED DESCRIPTION OF THE PREFERRED EMBODIMENT

Embodiments of the present invention are hereafter described with reference to the drawings wherein like references represent like parts throughout.

Figure 2:
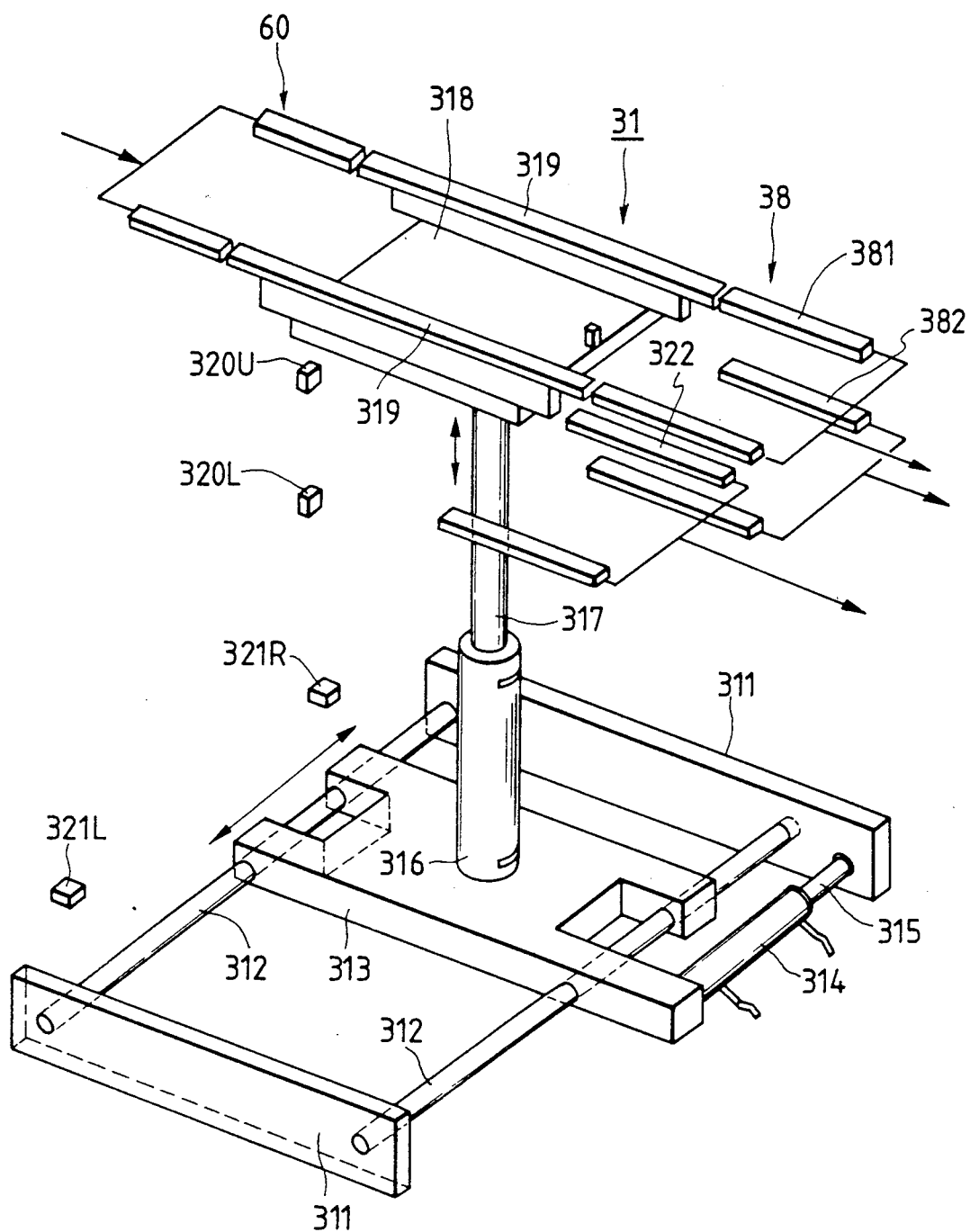
FIG. 2 shows a perspective view of the sliding traverser of the function inspecting system.
Figure 3:
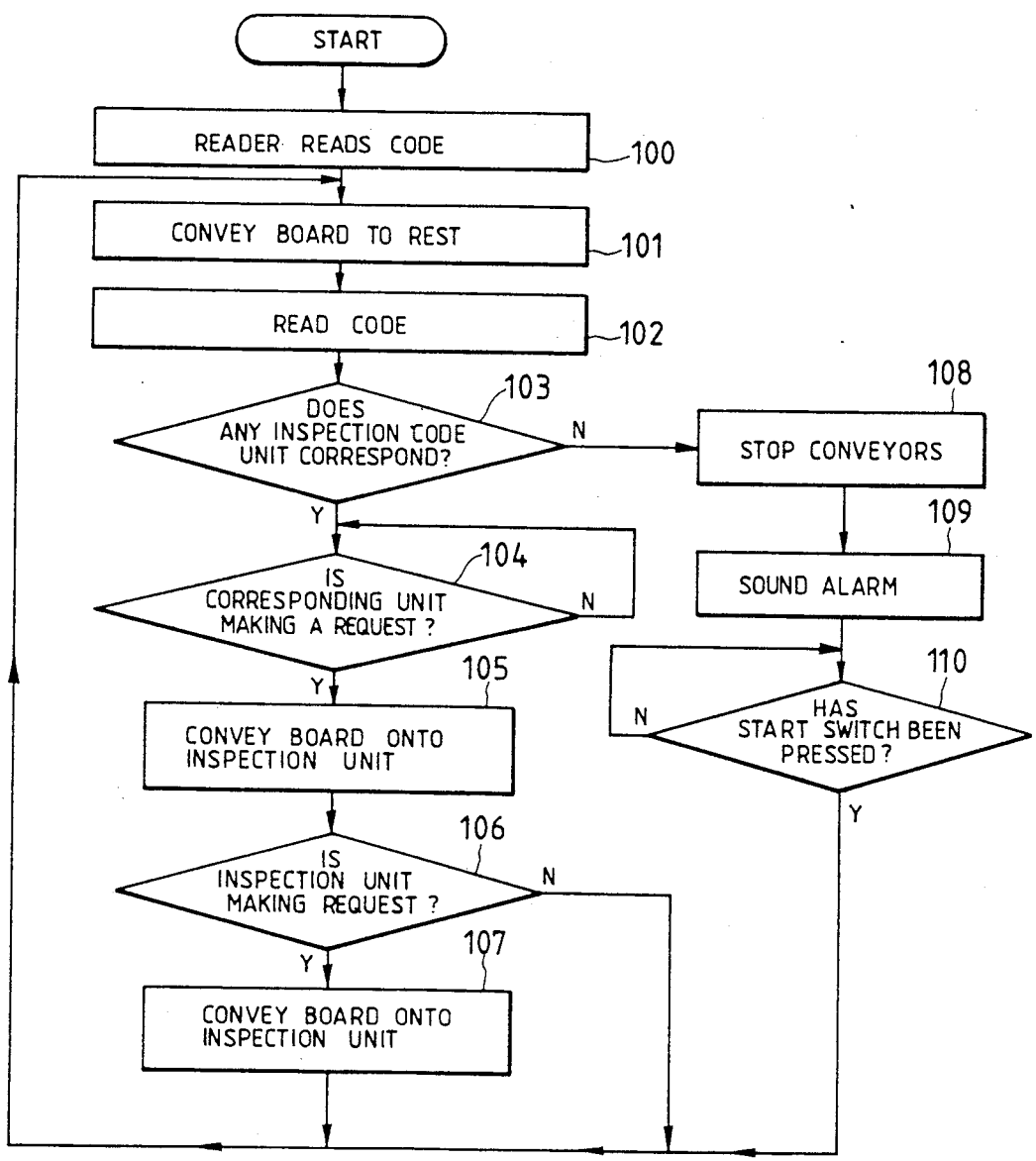
FIG. 3 shows a flow chart of the operation of the system.

FIGS. 1, 2 and 3 show a function inspecting system which is one of the embodiments. FIG. 1 shows a schematic view of the function inspecting system comprising a plurality of inspection units 21, 22, 23, 24, 25 and 26, a distributive conveyance means 30 and a control means 50. The first inspection unit 21 for inspecting a first item, the second inspection unit 22 for inspecting a second item, the third inspection unit 23 for inspecting a third item, the fourth inspection unit 24 for inspecting a fourth item, the fifth inspection unit 25 for inspecting a fifth item and the sixth inspection unit 26 for inspecting a sixth item are disposed at prescribed intervals. For example, the inspection units 21, 22, 23, 24, 25 and 26 can inspect the functions of printed circuit boards 10 of six mutually different types.

The distributive conveyance means 30 comprises sliding traverses 31, 32, 33, 34, 35, 36 and 37, and upper-and-lower-two-level belt conveyors 38, 39, 40, 41, 42 and 43, so that each of the printed circuit boards 10 to be inspected can be conveyed onto any of the inspection units 21, 22, 23, 24, 25 and 26, and the printed circuit boards 10 and the inspected printed circuit board can be conveyed away from the inspection unit. The first sliding traverser 31 is provided downstream of a belt conveyor 60 which conveys each printed circuit board 10 to the function inspecting system. The first inspection unit 21 and the first upper-and-lower-two-level belt conveyor 38 are provided downstream of the first sliding traverser 31. The second sliding traverser 32 is provided downstream of the first inspection unit 21. The second inspection unit 22 and the second upper-and-lower-two-level belt conveyor 39 are provided downstream of the second sliding traverser 32. The third sliding traverser 33 is provided downstream of the second inspection unit 22. The third inspection unit 23 and the third upper-and-lower-two-level belt conveyor 40 are provided downstream of the third sliding traverser 33. The fourth sliding traverser 34 is provided downstream of the third inspection unit 23. The fourth inspection unit 24 and the fourth upper-and-lower-two-level belt conveyor 41 are provided downstream of the fourth sliding traverser 34. The fifth sliding traverser 35 is provided downstream of the fourth inspection unit 24. The fifth inspection unit 25 and the fifth upper-and-lower-two-level belt conveyor 42 are provided downstream of the fifth sliding traverser 35. The sixth sliding traverser 36 is provided downstream of the fifth inspection unit 25. The sixth inspection unit 26 and the upper-and-lower-two-level belt conveyor 43 are provided downstream of the sixth sliding traverser 36. The seventh sliding traverser 37 is provided downstream of the sixth inspection unit 26. A belt conveyor 62 for conveying out each already-inspected printed circuit board 10 from the function inspecting system is provided downstream of the seventh sliding traverser 37.

The control means 50 comprises a reader 51 such as a bar code reader, which reads various kinds of information provided on the printed circuit boards 10 indicative of the types, electronic circuit functions and so forth of the printed circuit boards, and a programmable controller 55 which receives the information from the reader and information from the sliding traverses 31, 32, 33, 34, 35, 36 and 37, controls the driving of the traverses to convey in the printed circuit boards onto the inspection units 21, 22, 23, 24, 25 and 26, and gives inspection start signals to the inspection units.

FIG. 2 shows a perspective view of the sliding traverser 31 in which guide bars 312 are attached to bases 311. A slider 313 is movably fitted on the guide bars 312. A cylinder 314 is horizontally attached to the slider 313. The piston rod 315 of the cylinder 316 is vertically attached to the slider 313. A rest 318, on which the printed circuit board 10 is put, is provided on a rod 317 coupled to a piston which slides in the cylinder 316 to move the rest 318 up and down. Guide rails 319 are provided on the rest 318. A belt not shown in the drawings is provided beside the guide rails 319. Sensors 320U and 320L are provided beside the rest 318 so that the sensors send out signals to control the feed of a working fluid to the cylinder 316 to regulate the vertical movement of the rest 318 to cause the guide rails 319 on the rest 318 to coincide with the upper guide rail 381 and lower guide rail 382 of the upper-and-lower-two-level belt conveyor 38. Other sensors 321R and 321L are provided for the slider 313 so that the sensors send out signals to control the feed of a working fluid to the cylinder 314 to regulate the range of the movement of the slider to cause the guide rails of the slider to coincide with those of the upper-and-lower-two-level belt conveyor 38 or with those 211 of the first inspection unit 21. A sensor 322 is provided to detect that the printed circuit board 10 is put in a prescribed position on the rest 318. When the printed circuit board 10 conveyed downstream has reached the prescribed position on the rest 318, the sensor 322 acts to stop a belt conveyor provided for the rest 318 but not shown in the drawings. Each of the other sliding traverses 32, 33, 34, 35, 36 and 37 has the same constitution and operation as the first sliding traverser 31.

In operation when the printed circuit board 10 is conveyed on the belt conveyor 60, the reader 51 of the control means 50 reads the sign (such as a bar code) of the board in a step 100 shown in FIG. 3. The information of the sign read by the reader 51 is entered into the programmable controller 55. The controller then determines whether or not the rest 318 of the first sliding traverser 31 is located downstream to the belt conveyor 60. If the controller 55 has determined that the rest 318 is located downstream to the belt conveyor 60, the controller acts to convey in the printed circuit board 10 onto the rest 318, in a step 101. The controller 55 then finds out the type of the printed circuit board 10 from the information of the read sign thereof in a step 102. The controller 55 then determines in a step 103 whether or not any of the inspection units 21, 22, 23, 24, 25 and 26 corresponds to the type of the printed circuit board 10 to inspect it. If the controller 55 has determined in the step 103 that some inspection unit corresponds to the type of the printed circuit board 10, the controller determines in a step 104 whether or not the corresponding inspection unit is making a request to send the board to the unit. If the controller 55 has determined in the step 104 that the corresponding inspection unit is not making the request, the controller waits in the step 104. If the controller 55 has determined in the step 104 that the corresponding inspection unit is making the request, the controller acts to convey in the printed circuit board 10 onto the inspection unit in a step 105. If, for example, the printed circuit board 10 is conveyed to onto the function inspecting system by the belt conveyor 60, the reader 51 reads the data on the board and the third inspection unit 23 makes the request to convey the board onto the third inspection unit 23, and the programmable controller 55 gives a command to convey the board 10 to the first, the second and the third sliding traverses 31, 32 and 33. As a result, the board 10 is conveyed onto the third traverser 33 after being carried on the first traverser 31, the first upper-and-lower-two-level belt conveyor 38, the second sliding traverser 32 and the second upper-and-lower-two-level belt conveyor 39 in that order. When it is detected by the sensor 322 that the board 10 has reached the prescribed position on the rest 318 of the third sliding traverser 33, the conveyance of the board is stopped. The third sliding traverser 33 then moves the rest 318 and the board 10 is conveyed onto the third inspection unit 23.

When the programmable controller 55 has determined that no inspection unit is making a request to convey the printed circuit board 10 thereto after inspection by third inspection unit 23, the controller 65 completes a processing flow and returns to the step 101. If the controller 55 has determined that another inspection unit is making a request, the controller acts to convey the board to that inspection unit. Therefore, the printed circuit board 10 which has been inspected by the third inspection unit 23, is moved by fourth sliding traverser 34 as shown by an arrow B in FIG. 1. It is then determined by the sensor 321L whether or not the traverser has reached a prescribed position. When it is determined by the sensor 321L that the traverser 34 has reached the prescribed position, the traverser is stopped. The traverser 34 thereafter receives the printed circuit board 10 from the third inspection unit 23. The programmable controller 55 is then informed of the result of the inspection of the board 10. After that, the fourth sliding traverser 34 moves as shown by an arrow C in FIG. 1, and it is then determined by the sensor 321R whether or not the traverser has reached another prescribed position. When it is determined by sensor 321R that the traverser 34 has reached another prescribed position, the traverser 34 is stopped. The sliding traverser 34 then puts the printed circuit board 10 on the lower guide rail 382 of the fourth upper-and-lower-two-level belt conveyor 41. After that, the programmable controller 55 gives commands to the fifth, the sixth and the seventh sliding traverses 35, 36 and 37 to convey the already-inspected printed circuit board 10. As a result, the printed circuit board 10 is conveyed by the fourth upper-and-lower-two-level belt conveyor 41, the fifth sliding traverser 35, the fifth upper-and-lower-two-level belt conveyor 42, the sixth sliding traverser 36, the sixth upper-and-lower-two-level belt conveyor 43 and the seventh sliding traverser 37 in that order so that the board is finally put on the belt conveyor 62.

If the programmable controller 55 has determined in the step 103 that none of the inspection units 21, 22, 23, 24, 25 and 26 corresponds to the type of the printed circuit board 10 to inspect it, the controller regards the type of the board as different from that corresponding to some of the inspection units and temporarily stops the conveyors and so forth in a step 108. The controller 55 then sounds a buzzer or the like to inform the operating person of the difference, in a step 109. The controller 55 then waits for the pressing of a start switch, in a step 110.

Since the function inspecting system has the above-described constitution and operation, it can inspect a plurality of types of printed circuit boards 10 in nearly the same place. For that reason, the period of the inspection is shortened. Since the system can inspect a plurality of types of printed circuit boards 10 at the same time, the system is appropriate to inspect a large number of types of printed circuit boards, the number of which is relatively small. In addition, the system can inspect a larger number of printed circuit boards of the same type in a greatly shortened period.

Although the function inspecting system inspects the printed circuit boards, the present invention is not confined thereto but may be otherwise embodied as a function inspecting system for inspecting an appliance having at least one printed circuit board.

FIG. 4 shows a schematic view of a second embodiment of the function inspecting system of the present invention. The difference of the system from that shown in FIGS. 1, 2 and 3 is that belt conveyors 38', 39', 40', 41', 42', 43', 38", 39", 40", 41" and 43" are provided at both sides of inspection units 21, 22, 23, 24, 25 and 26, sliding traverses 31', 32', 33', 34', 35', 36' and 37' can be moved to the belt conveyors, and a belt conveyor 64 for conveying out an accepted printed circuit board 10 and a belt conveyor 66 for conveying out a rejected printed circuit board 10 are provided, in the system shown in FIG. 4. The function inspecting system shown in FIG. 4 produces the same effects as that shown in FIGS. 1, 2 and 3. However, the system shown in FIG. 4 can sort the printed circuit boards 10 and convey them separately from each other, depending on the results of the inspection of the boards.

FIG. 5 shows a schematic view of a third embodiment of the function inspecting system of the present invention. The difference between the third embodiment and the first embodiment is that an incoming sliding traverser 31" and an outgoing sliding traverser 32" are provided at the incoming sides and outgoing sides of inspection units 21, 22, 23, 24, 25 and 26, respectively, and a traversing unit 45 which receives a printed circuit board 10 from a belt conveyor 60 and conveys the board onto the incoming sliding traverser 31", and a traversing unit 46 which receives an already-inspected printed circuit board 10 from the outgoing sliding traverser 32" and conveys the board to a belt conveyor 64 or a belt conveyor 66 depending on the result of the inspection of the board are provided, in the system shown in FIG. 5. The third embodiment shown in FIG. 5 produces the same effects as the first embodiment shown in FIGS. 1, 2 and 3. However, belt conveyors such as the upper-and-lower-two-level belt conveyors 38, 39, 40, 41, 42 and 43 in the first embodiment are not necessary in the third embodiment shown in FIG. 5.

Since each of the function inspecting systems shown in FIGS. 4 and 5 can inspect a plurality of types of printed circuit boards in nearly the same place, the period of the inspection of the boards is shortened. Since each of the systems can inspect a plurality of printed circuit boards at the same time, each of the systems is appropriate to inspect a large number of types of printed circuit boards, the number of which is relatively small. In addition, each of the systems can inspect a large number of printed circuit boards of the same type in a greatly shortened period. Although each of the systems inspects the printed circuit boards, the present invention is not confined thereto but may be otherwise embodied as a function inspecting system for inspecting an appliance having at least one printed circuit board.

While the invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A function inspecting system comprising:
   a plurality of inspection means for inspecting respective functions of an appliance each having an electronic circuit conveyed thereto;
   a distributive conveyance means for conveying an appliance to and from any of said inspection means, the distributive conveyance means comprising a plurality of belt conveyors cooperating with a plurality of sliding traversers interspersed therewith, each belt conveyor having a generally planar upper surface upon which each applicant is conveyed, each sliding traverser traversing in a plane generally parallel to the planar upper surface of each belt conveyor, each sliding traverser being operable to allow the appliance to be conveyed from one belt conveyor to the next belt conveyor, each sliding traverser also being operable to convey an appliance from one belt conveyor to the inspection means and from the inspection means to the next belt conveyor, such that an appliance is conveyed onto the each inspection means as is necessary to inspect the functions of the appliance and bypasses inspection means where no inspection is necessary; and an automatic control means for controlling the operation of said distributive conveyance means.

2. A function inspecting system according to claim 1, wherein the appliances are printed circuit boards.

3. A function inspecting system according to claim 1, wherein the appliances are electronic appliances which include printed circuit boards constituting the electronic circuits and perform prescribed functions.

4. A function inspecting system of claim 1 wherein said control means includes a reader to read a code on said appliance indicative of the type of electronic circuit function to be inspected.

5. A function inspecting system as in claim 4 wherein said reader is a bar code reader.

6. A function inspecting system as in claim 5 wherein said control means further includes a programmable controller to control the operation of said conveyance means.

7. A function inspecting system as in claim 6 wherein said inspecting system further includes a sorting means in connection with said conveyance means to convey out of the system the appliances determined to be functioning properly separately from said appliances determined to be functioning improperly.

8. A function inspecting system as in claim 7 wherein each of said plurality of sliding traversers comprises:

a rest for placement of said appliance; and
a piston and cylinder combination for moving said rest vertically with respect to said inspecting system in response to fluid in said cylinder.

9. A function inspecting system as in claim 8 wherein said function inspecting system comprises upper and lower belt conveyors for conveying the appliance between adjacent sliding traversers.

10. A function inspecting system as in claim 9 wherein said sliding traversers further comprise a piston/cylinder control means for controlling the fluid to said cylinder.

11. A function inspecting system as in claim 10 wherein said sliding traversers each include a sensor for sensing the position of 12. A function inspecting system as in claim 11 wherein said sensor includes a control means to stop the movement of said appliance once said appliance has reached a predetermined position on said rest.

13. A function inspecting system as in claim 3 wherein said system further comprises:

an incoming sliding traverser for moving said appliance between inspecting units;
a first traversing unit for receiving said appliance into said system and moving said appliance onto said incoming sliding traverser;
a second traversing unit for moving said appliance out of the system;
an outgoing sliding traverser for moving said appliance from said inspecting units to said second traversing unit.

* * * * *